United States Patent
Xiao et al.

(10) Patent No.: US 11,081,154 B1
(45) Date of Patent: Aug. 3, 2021

(54) SYNTHETIC MAGNETIC PINNING ELEMENT HAVING STRONG ANTIFERROMAGNETIC COUPLING

(71) Applicants: Rongfu Xiao, Dublin, CA (US); Yimin Guo, San Jose, CA (US); Jun Chen, Fremont, CA (US)

(72) Inventors: Rongfu Xiao, Dublin, CA (US); Yimin Guo, San Jose, CA (US); Jun Chen, Fremont, CA (US)

( * ) Notice: Subject to any disclaimer, the term of this patent is extended or adjusted under 35 U.S.C. 154(b) by 67 days.

(21) Appl. No.: 16/773,283

(22) Filed: Jan. 27, 2020

(51) Int. Cl.
| | |
|---|---|
| *G11C 11/16* | (2006.01) |
| *H01L 27/22* | (2006.01) |
| *H01L 43/10* | (2006.01) |
| *H01L 43/08* | (2006.01) |
| *H01L 43/02* | (2006.01) |

(52) U.S. Cl.
CPC .......... *G11C 11/161* (2013.01); *H01L 27/222* (2013.01); *H01L 43/02* (2013.01); *H01L 43/08* (2013.01); *H01L 43/10* (2013.01)

(58) Field of Classification Search
CPC ..... G11C 11/161; H01L 27/222; H01L 43/02; H01L 43/08; H01L 43/10
USPC ....................................................... 257/421
See application file for complete search history.

(56) References Cited

U.S. PATENT DOCUMENTS

| | | | | |
|---|---|---|---|---|
| 6,828,036 | B1* | 12/2004 | Munteanu ............ | G11B 5/7369 428/828.1 |
| 10,468,457 | B1* | 11/2019 | Zeng ..................... | H01L 43/10 |
| 2003/0180577 | A1* | 9/2003 | Do ........................ | G11B 5/82 428/836.1 |
| 2008/0311431 | A1* | 12/2008 | Fuji ....................... | G11B 5/3903 428/836 |
| 2010/0226048 | A1* | 9/2010 | Fukuzawa ............ | G11B 5/3983 360/324.12 |
| 2012/0181537 | A1* | 7/2012 | Cao ........................ | H01L 43/08 257/53 |
| 2017/0338829 | A1* | 11/2017 | Lu .......................... | H03L 7/26 |
| 2019/0051822 | A1* | 2/2019 | Chatterjee ............ | H01F 10/3272 |
| 2019/0252601 | A1* | 8/2019 | Chatterjee ............ | H01F 10/3254 |
| 2020/0052191 | A1* | 2/2020 | Ma ........................ | H01L 27/228 |
| 2021/0134504 | A1* | 5/2021 | Ma ........................ | H01L 43/08 |

FOREIGN PATENT DOCUMENTS

CN            112635656 A   *  4/2021

\* cited by examiner

*Primary Examiner* — Jami Valentine Miller

(57) ABSTRACT

The present invention discloses an enhanced synthetic antiferromagnetic (eSAF) element with a very strong RKKY coupling comprising a magnetic pinning layer having a face-center-cubic (fcc) crystalline structure and a magnetic reference layer having a body-center-cubic (bcc) crystalline structure which are antiferromagnetically coupled by a composite non-magnetic spacer (CnmS) containing a bi-layer of (Ru, Rh or Ir)/Cr or tri-layer of (Ru, Rh, or Ir)/(W, Mo, or V)/Cr. With such eSAF, a strong magnetic pinning element is formed which can be used to make various thin STT-MRAM film stacks with good thermal and magnetic stability while maintaining high TMR value.

17 Claims, 6 Drawing Sheets

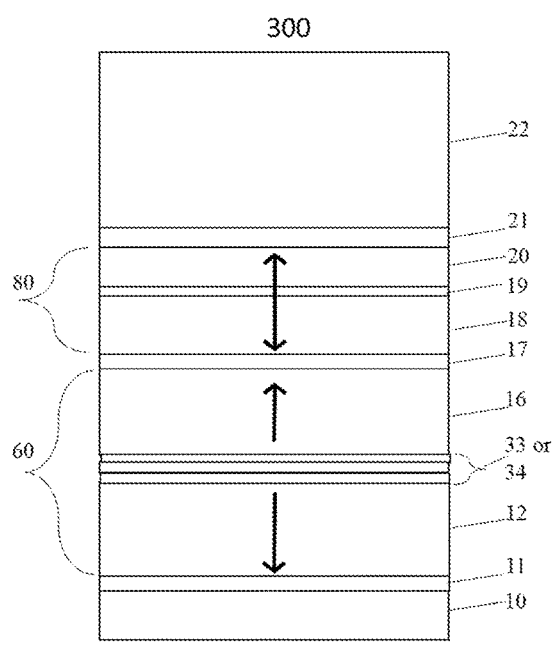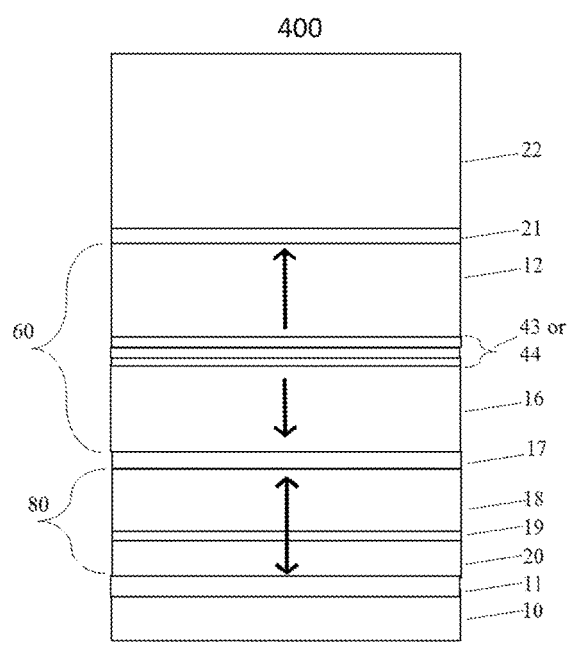

SYNTHETIC MAGNETIC PINNING ELEMENT HAVING STRONG ANTIFERROMAGNETIC COUPLING

BACKGROUND OF THE INVENTION

1. Field of the Invention

This invention relates to a synthetic magnetic pinning element having a strong antiferromagnetic (AFM) coupling. More specifically, the invention comprises an enhanced synthetic antiferromagnetic (eSAF) element to maximize magnetic pinning for spin-transfer-torque (STT) or spin-orbit-torque (SOT) magnetic-random-access memory (MRAM) using perpendicular magnetoresistive element as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed reference layer that is located on the opposite side from the recording layer and maintains a predetermined magnetization direction. The insulating spacing layer serves as a tunneling barrier (TB) in a magnetic tunnel junction. In a SOT MRAM, there is an additional SOT layer immediately located on a surface of the recording layer, which is opposite to a surface of the recording layer where the insulating spacing layer is provided. SOT can be a thin layer made of heavy transition metal layer such as W or Ta, Pt, etc., or a layer of topological insulating layer such as BiSB.

As a write method to be used in such magnetoresistive elements of a STT MRAM, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents. In a SOT MRAM, an electric current flows in the SOT layer, which is also a paramagnetic layer, to generate a spin-polarized current and inject it into its adjacent recording layer, which is a ferromagnetic layer. The spin-polarized current then exerts a torque on the magnetic moment to reverse it.

Further, as in a so-called perpendicular pMTJ element, both two magnetization films, i.e., the recording layer and the reference layer, have easy axis of magnetization in a direction perpendicular to the film plane due to their strong magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and a bcc or hcp-phase cap layer that sandwich a thin recoding layer (RL) having an amorphous CoFeB ferromagnetic film and accelerate crystallization of the amorphous ferromagnetic film to match interfacial grain structure to MgO layer through a thermal annealing process. The RL crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunnel junction structure is formed. By using this technique, a high MR ratio can be achieved.

A core element of pMTJ stack comprises a magnetically fixed pinning layer (PL), a tunnel barrier (TB), and a variable recording layer (RL). The PL is typically formed by a relatively thick perpendicular synthetic antiferromagnetic (pSAF) stack of composition: seed-layer/[Co/X]$_m$/Co/Ru/Co/[X/Co]$_n$/crystal-structure-breaking-layer /FeCoB/tunnel-barrier, where X represents Pt, Pd or Ni metals, m and n are integers (normally m>n), and Ru is a spacer to provide perpendicular RKKY coupling between [Co/X]$_m$/Co and Co/[X/Co]$_n$. Full film stack of a typical bottom-pinned pMTJ (100) is shown in FIG. 1 which starts on a substrate (10) from a seed layer such as Pt (11), a perpendicular synthetic antiferromagnetic (pSAF) multilayer structure or superlattice [C/Pt]$_m$/C (12), a Ru spacer (13), another upper multilayer structure or superlattice Co/[Pt/Co]$_n$ (14), a crystal structure transition layer such as W, Mo or Ta (15), an amorphous CoFeB (16), a TB MgO (17), a tri-layer RL formed with a first CoFeB (18), a non-magnetic spacer such as W, Mo or Ta (19) and a second CoFeB (20), a capping layer, such as MgO, W or W/Ru (21) and hard mark layer for etching such as Ta or Ti (22). This pMTJ film stack is quite thick although it has a strong pSAF.

Recently a French research group proposed (see Scientific Reports 8, Article number: 11724, 2018) a thin synthetic antiferromagnetic (tSAF) structure of seed-layer /[Co/Pt]m/Co(12)/Ru/W(23)/FeCoB(16)/tunnel-barrier (film stack 200 in FIG. 2) with all the layers 10, 11, 12, 16, 17, 18, 19, 20, 21 and 22 same as those in FIG. 1 except no layers 14 and 15 and the Ru spacer 13 was replaced by a bi-layer Ru(231)/W(232) spacer (23) which is in contact with Co layer of the stack 12 from below and amorphous CoFeB (16) layer from above (see FIG. 3). Although the authors claimed multi-functionalities of such bi-layer Ru/W spacer (23): (i) absorbing boron out of the magnetic layer (FeCoB) in contact with W layer upon annealing, (ii) allowing the crystalline transition between the fcc part of the stack [Co/Pt]m/Co of 3-fold symmetry and the bcc part of the stack FeCoB next to the MgO barrier (of 4-fold symmetry) and (iii) preventing interdiffusion between the two parts of the SAF during high temperature annealing. RKKY coupling at W/CoFeB interface is not as strong as at the Co/Ru interface.

SUMMARY OF THE PRESENT INVENTION

The present invention discloses an enhanced synthetic antiferromagnetic (eSAF) element with a very strong RKKY coupling comprising a magnetic pinning (PL) layer having a face-center-cubic (fcc) crystalline structure and a magnetic reference layer (RL) having a body-center-cubic (bcc) crystalline structure which are antiferro-magnetically coupled by a composite non-magnetic spacer (CnmS) containing a bi-layer of (Ru, Rh or Ir)/Cr or tri-layer of (Ru, Rh, or Ir)/(W, Mo, or V)/Cr. Said eSAF element comprises either of Co/CnmS/Fe, Co/CnmS/FeB, FeCo(>50%)/CnmS/Fe (>50%)Co, or Co/CnmS/Fe(>40%)CoB; wherein said pure Co or Co-rich (>50%) layer is the interfacial portion of the PL contacting with (Ru, Rh, or Ir) and pure Fe or Fe-rich (>50%) layer is the interfacial portion of the RL contacting with Cr.

Said eSAF element with a very strong RKKY coupling are employed to form a perpendicular magnetoresistive element (PME) which comprises (in a series of) said eSAF element (PL/CnmS/RL) having a magnetic anisotropy in a direction perpendicular to a film surface and having an invariable magnetization direction; a tunnel barrier (TB) layer on the reference layer; a storage layer (SL) having magnetic anisotropy in a direction perpendicular to a film surface and having a variable magnetization direction on the tunnel barrier layer and a capping layer (CL), with the full stack in a form of substrate/seed layer/PL/CnmS/RL/TB/SL/CL.

The application of said eSAF element including perpendicular bottom-pinned pSTT-MRAM, top-pinned pSTT-MRAM and dual-pinned pSTT-MRAM as well as in-plane iSTT-MRAM (both bottom and top-pinned). Said eSAF element can also be used for SOT-MRAM.

Said perpendicular magnetoresistive element (PME) in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

BRIEF DESCRIPTION OF THE DRAWINGS

FIG. 5 Said eSAF with a bi-layer CnmS (Ru, Rh, or Ir)/Cr) that maximize RKKY coupling between two different magnetic materials (Co and Fe) in contact with.

FIG. 6 Said eSAF with a tri-layer CnmS (Ru, Rh, or Ir/W, or Mo/Cr) that maximize RKKY coupling between two different magnetic materials (Co and Fe) in contact with.

FIG. 7 A bottom-pinned pSTT-MRAM film stack using said eSAF;

FIG. 8 A top-pinned pSTT-MRAM film stack using said eSAF;

DETAILED DESCRIPTION OF THE INVENTION

Figure 1:
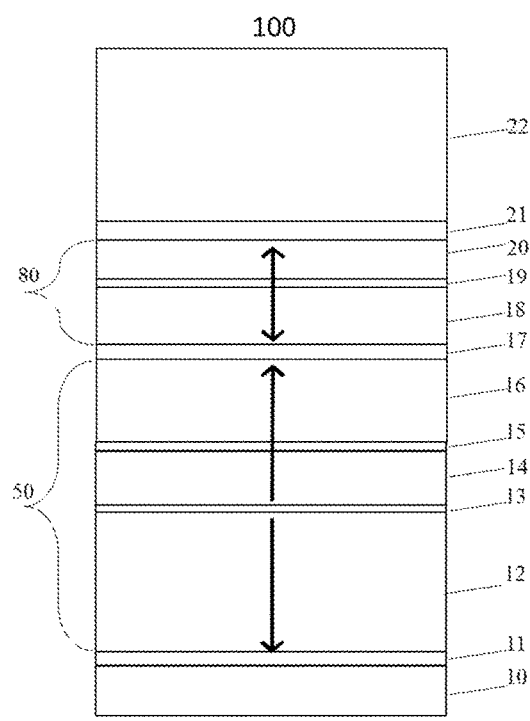
FIG. 1 A conventional thick perpendicular magnetoresistance film stack for a pSTT-MRAM.
Figure 2:
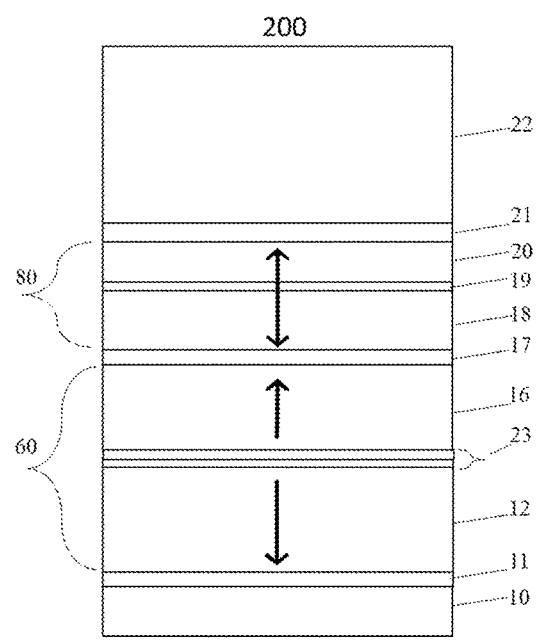
FIG. 2 A pSTT-MRAM film stack with a thin synthetic antiferromagnetic (tSAF) pinning layer.
Figure 3:
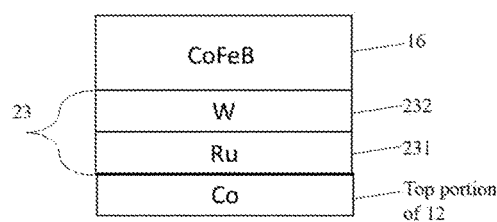
FIG. 3 Ru/W bi-layer as an AF coupling spacer for said tSAF in contact Co and CoFeB.
Figure 4:
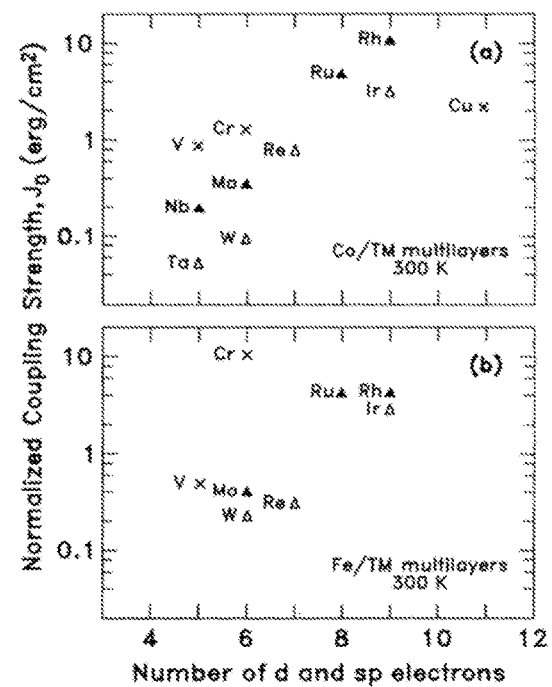
FIG. 4 RKKY magnetic coupling through the 3d, 4d, and 5d transition metals in contact with Co (a) and Fe (b)
Figure 5:
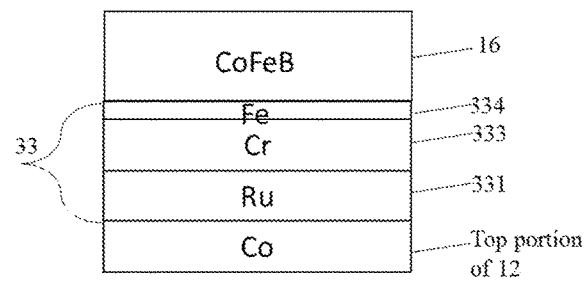
Figure 6:
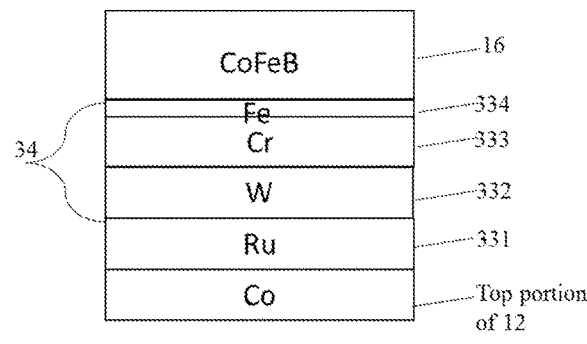

To search for a strong magnetic pinning while keeping a thin tSAF, we examined the RKKY magnetic coupling through various 3d, 4d, and 5d transition metals first studied (see FIG. 4) by S.S Parkin (Phys. Rev. Lett., vol. 67, no. 25, pp. 3598-3601, 1991) and found that the best coupling would occur in a multi-layer structure of Co/(Ru, Rh or Ir)/Cr/Fe in which both Co/(Ru, Rh or Ir) and Cr/Fe exhibit a maximum RKKY coupling in their pair (see FIG. 5) in a combined stack 33 containing Ru(331)/Cr(333)/Fe(334) with Ru in contact with Co which is the top portion of layer 12 and Fe in contact with CoFeB layer (16), or with a middle (W or Mo) layer in between to form a combined stack 34 containing (Ru, Rh, Ir) (331)/W (or Mo)(332)/Cr(333)/Fe (334) with Ru (or Rh, Ir) in contact with Co layer (top portion of 12) and Fe in contact with CoFeB (16) (see FIG. 6). Thus replacement of single layer (Ru, Rh or Ir) spacer by a bi-layer (Ru, Rh or Ir)/Cr or tri-layer (Ru, Rh or Ir)/(W, Mo)/Cr spacer would form an enhanced synthetic antiferromagnetic (eSAF) element which will have advantages of (1) achieving the strongest RKKY coupling, (2) absorbing boron out of the magnetic layer (FeCoB) in contact with the Cr layer or (W or Mo)/Cr layer upon annealing, (3) allowing the crystalline transition between the fcc part of the stack [C/Pt]m/Co of 3-fold symmetry and the bcc part of the stack Fe/FeCoB next to the MgO barrier (pure Fe naturally has a bcc structure), (4) preventing inter-diffusion between the two parts of the SAF, and (5) avoiding of TMR deterioration due to Pt diffusion into CoFeB layer during high temperature annealing. The film structure of FIG. 5 and FIG. 6 can also be reversed to form a film stack (43) of CoFeB(16)/Cr(333)/(Ru, Rh or Ir) (331)/Co(part of 12) and a film stack (44) of CoFeB(16)/Cr(333)/(W or Mo)(332)/(Ru, Rh, or Ir) (331)/Co(part of 12) which will be used for top-pinned pSTT-MRAM devices.

It is well-known in prior art that for a single layer of Ru spacer, its peaks of maximum RKKY coupling occur around 0.4 nm (first peak) and 0.8 nm (second peak). As for the (Ru, Rh or Ir)/Cr bi-layer or (Ru, Rh or Ir)/(W or Mo)/Cr tri-layer spacer, we should choose Ru, Rh, or Ir with a thickness between 0.3-0.7 nm and Cr or (W or Mo)/Cr with a thickness between 0.5 nm to 0.1 nm so that the thickness combination of Ru/Cr or (Ru, Rh or Ir)/(W or Mo)/Cr can form an effective first peak and/or $2^{nd}$ peak of RKKY coupling together with their interfacial magnetic layer of Co and Fe. With such Co/[(Ru, Rh or Ir)/Cr]/Fe (FIG. 5) or reversed Fe/[Cr/(Ru, Rh or Ir)]/Co (43) and Co/[(Ru, Rh or Ir)/(W or Mo)/Cr]/Fe (FIG. 6) or reversed Fe/[Cr/(W or Mo)/(Ru, Rh or Ir)]/Co (44) eSAF stack, we can use it for various device applications shown below.

First Embodiment

FIG. 7 is a bottom-pinned pSTT-MRAM film stack (300) with said eSAF coupling. A seed layer (11) (selected among Pt, NiCr, Ru, Hf, or V) was first grown with a thickness between 1-8 nm on a substrate (10), followed by a magnetic superlattice $[Co/X]_m$ (m is an integer between 2-6) with thickness of Co(0.25-0.6 nm)/X(0.2-0.4 nm) (12) on top of the seed layer (11) where X is selected among Pt, Pd or Ni, a composite eSAF Co/(Ru, Rh, or Ir)/Cr/Fe (33) or Co/(Ru, Rh, or Ir)/(W, or Mo)/Cr/Fe (34), an amorphous FeB or CoFeB (16) reference layer in contact with Fe from below, a tunnel barrier MgO (17), a tri-layer recording layer formed with a first magnetic layer (18), a non-magnetic bridging layer (19) and a second magnetic layer (20), a capping layer, such as MgO, W or W/Ru (21) and hard mark layer for etching such as Ta or Ti (22). In the above stack, the thickness of Ru, Rh, or Ir is between 0.3 to 0.7 nm and Cr or (W or Mo)/Cr thickness is between 0.1 to 0.5 nm, with a combined (Ru, Rh or Ir)/Cr or (Ru, Rh or Ir)/(W or Mo)/Cr thickness chosen to reach the first or second peak for an effective RKKY coupling, the amorphous FeB or CoFeB reference layer (16) has a B composition between 15-35% with a thickness between 0.8 to 1.4 nm, the thickness of MgO TB is between 0.8-1.2 nm, the thickness of the first magnetic memory layer (20) can be selected among CoFeB, FeB, Fe/CoFeB with a B composition between 15-30% and preferably at 20% and a thickness between 1-1.6 nm, the non-magnetic bridging layer is selected among W, Mo, Ta with a thickness between 0.1-0.6 nm, the second magnetic memory layer (20) is selected from CoFeB, FeB with a B composition between 15-30% with a thickness between 0.4-0.8 nm, the capping layer is can be either (1-1.5 nm)MgO/(2-5 nm)W, (2-5 nm)W/(2-4 nm)Ru or MgO/W/Ru and Ta has a thickness between 50-100 nm acting as a hard mask for etching. The annealing temperature of above film stack is between 350 C-450 C for 30 min to 150 min which will convert the upper portion of the stack above Cr into a bcc crystalline structure while keeping the low portion of the super-lattice stack at fcc crystalline structure.

The use of Fe at the Cr interface, not only increases the RKKY coupling hence improving magnetic stability for the device, but also creates a good bcc structure right starting from the CoFeB reference layer (RL), throughout the barrier MgO layer to the entire memory tri-layer layer owing to the intrinsic bcc structure of Fe. Such a bottom-pinned pSTT-MRAM film stack will have strong magnetic pinning with sharp layer interfaces and higher and stable TMR characteristics, which is good for pSTT-MRAM device application.

Second Embodiment

FIG. 8 is a top-pinned pSTT-MRAM film stack (400) with said eSAF coupling with a reversed layer structure (except the seed and capping layers) as compared with the above bottom-pinned pSTT-MRAM, seed layer(11)/memory tri-layer (20,19,18)/MgO(17)/CoFeB(16)/Fe(334)/Cr(333)/(Ru, Rh, Ir) (331)/(12)Co/[Co/X]d capping layer (21) and hard mask (22). A seed layer (11) selected among (W, Ta or Pt)/MgO or BiSB/MgO was first grown on a substrate (10), followed a tri-layer memory layer (ML) stack (20,19,18), followed by a reversed composite eSAF stack of 33 or 34, Fe/[Cr/(Ru, Rh or Ir)](43)/Co or Fe/Cr/(W, Mo or V)/(Ru, Rh or Ir)(44)/Co with a thickness of Ru, Rh or Ir is between 0.3 to 0.7 nm and Cr or (W, Mo or V)/Cr thickness is between 0.1 to 0.5 nm, in contact with a magnetic superlattice pinning layer (PL) of [Co/Pt, Pd, or Ni]/Co (12) (m is an integer between 2-6). The film stack is then covered by a capping layer (21) of either (1-1.5 nm)MgO/(2-5 nm)W, (2-5 nm)W/(2-4 nm)Ru or MgO/W/Ru and Ta (22) has a thickness between 50-100 nm acting as a hard mask for etching. The annealing temperature of above film stack is between 350 C-450 C for 30 min to 150 min which will convert the lower portion of the stack below Cr into bcc crystalline structure while keeping the upper portion of the superlattice stack with an fcc crystalline structure.

Again, the use of Fe at the Cr interface, not only increases the RKKY coupling hence improving magnetic stability for the device, but also creates a good bcc structure right starting from the CoFeB reference layer (RL), throughout the barrier MgO layer to the entire memory tri-layer layer owing to the intrinsic bcc structure of Fe. Such a top-pinned pSTT-MRAM film stack will have strong magnetic pinning with sharp layer interfaces and higher and stable TMR characteristics, which is good for spin-orbit torque (SOT) type MRAM device application.

Third Embodiment

Figure 9:
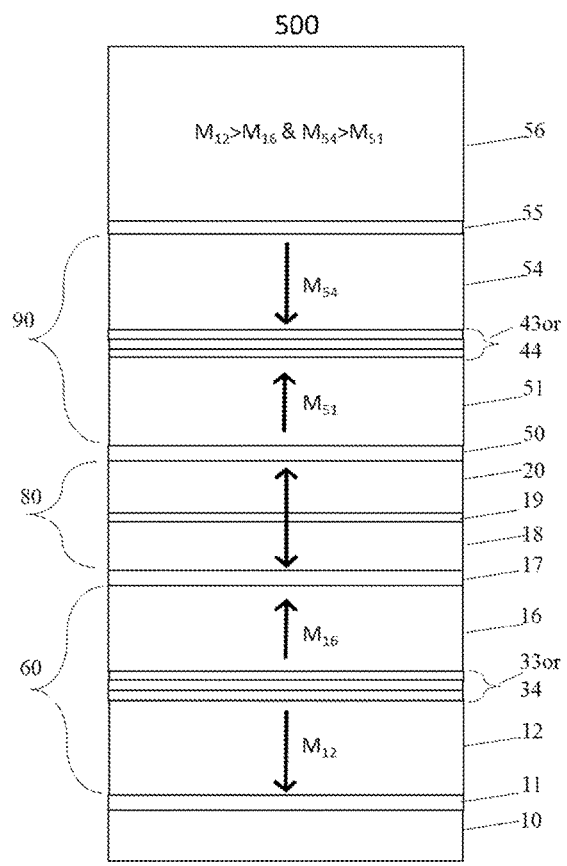
FIG. 9 A dual-pinned pSTT-MRAM film stack using said eSAF with $M_{12}>M_{16}$ & $M_{54}>M_{51}$.

FIG. 9 is a dual-pinned pSTT-MRAM film stack (500) with said eSAF coupling, which is formed by combining a bottom-pinned pSTT-MRAM with a top-pinned pSTT-MRAM. The first half the film stack is the same as shown in FIG. 7 and the second upper part is the same as the structure shown in FIG. 8. A typical structure of such film stack would be like this: substrate/Pt(11)/[Co/Pt]m/Co(12)/(Ru/Cr)(33) or (Ru/W/Cr) (34) /Fe/CoFeB(16)/MgO(17)/CoFeB(18)/W (19)/CoFeB(20)/MgO(50)/CoFeB(51)/Fe/(Cr/Ru) (43) or (Cr/W/Ru)(44)/Co/[Pt/Co]$_n$(54)/W(55)/Ta(56). Such a dual-pinned pSTT-MRAM film stack not only allows to further increase the perpendicular anisotropy (PMA) to the middle composite storage layer (CSL) and thus increase the thermal stability and prolong the retention time of MRAM device but also allows to increase the thickness of the CSL (from 1.8 nm to 4 nm) which further increases TMR value.

Figure 10:
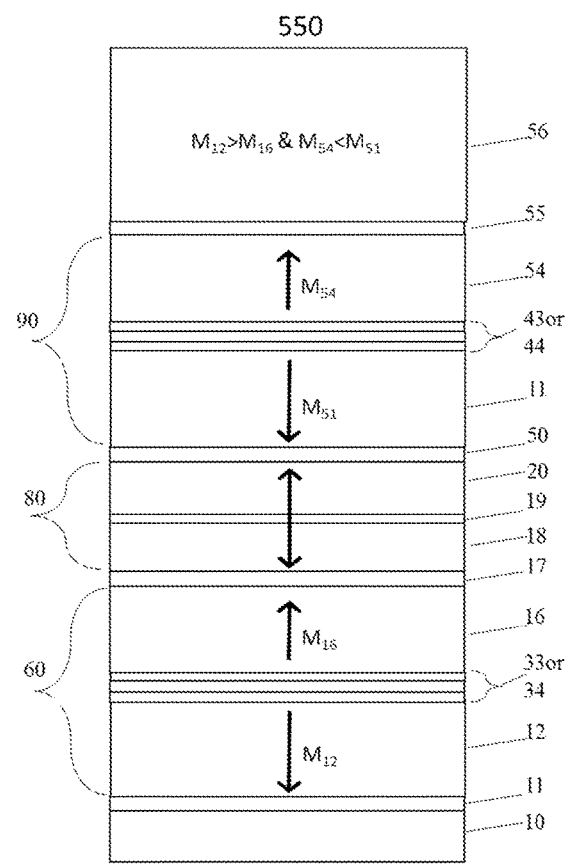
FIG. 10 A dual-pinned pSTT-MRAM film stack using said eSAF with $M_{12}>M_{16}$ & $M_{54}<M_{51}$.

By adjusting the tunnel barrier thickness of the two MgO(17) and MgO(50) sandwiching the middle CSL CoFeB(18)/W(19)/CoFeB(20), the two different RAs and TMRs can be obtained. It is possible to achieve addition of TMR1+TMR2 after a high field reset if the condition of $M_{12} > M_{16}$ and $M_{54} > M_{51}$ are met as shown in FIG. 9. In FIG. 10, the two pairs of pSAF have an opposite magnetic thickness so that the condition of $M_{12} > M_{16}$ and $M_{54} < M_{51}$ are met, the upper portion of the top-pinned pSTT-MRAM can help to improve the thermal stability of the magnetic device by adjusting its TMR2 value close to zero.

Said dual-pinned pSTT-MRAM film stack can also be used to make a four-state memory device on each recording bit by reducing the pinning strength of the top-pinned pMTJ film stack, for example using a thicker Cr/Ru (or Cr/W/Ru) at its second or even third peak while keeping the bottom-pinned pMTJ at the first peak with a strong RKKY coupling. During writing processes, both the memory layer and the top pMTJ change their state of resistance respectively at different current level, thus their state (high and low resistance) combination will create four different states for the memory bit.

Due to absence of Pt in the middle region of said dual-pinned pSTT-MRAM film stack (no Co/Pt superlattice layer between the two Ru spacers in the lower bottom-pinned pSTT-MRAM and upper top-pinned pSTT-MRAM, deterioration of TMR due to Pt diffusion into CoFeB layers (see discussion in Scientific Reports, volume 9, Article number: 11932, 2019) is completely avoided, which is clearly seen from an exemplar dual pinned pSTT-MRAM film structure CuN/Pt/[Co/Pt]$_2$/Co/Ru/Cr/Fe/CoFeB/MgO/CoFeB/W/CoFeB/MgO/CoFeB/Fe/Cr/Ru/Co/[Pt/Co]$_2$/W/Ta.

Forth Embodiment

Figure 11:
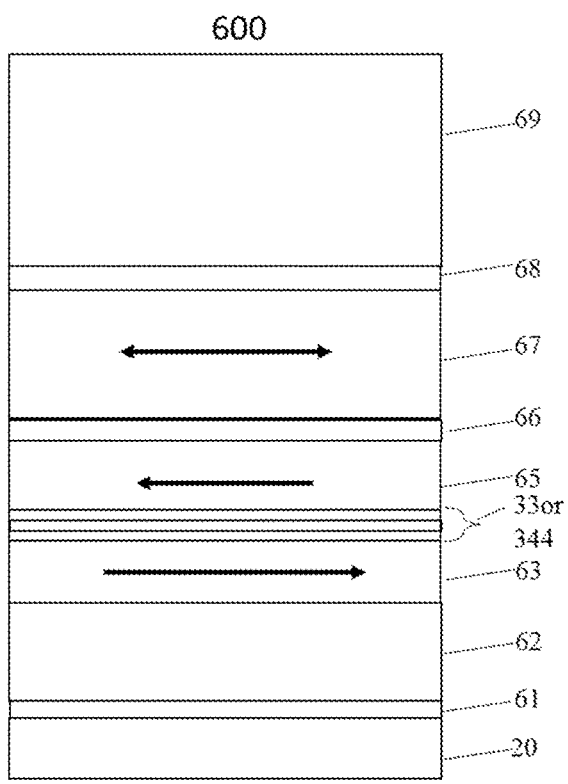
FIG. 11 A bottom-pinned in-plane iMTJ film stack using said eSAF.
Figure 12:
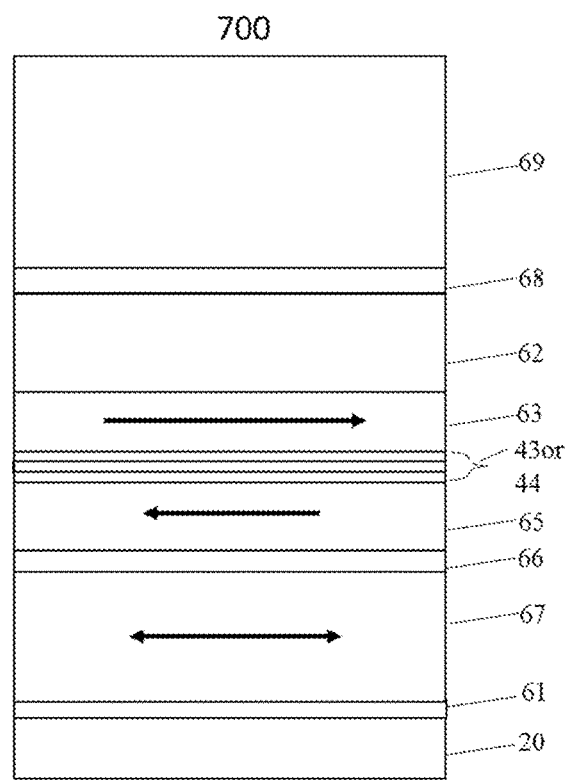
FIG. 12 A top-pinned in-plane MTJ film stack using said eSAF.

Said eSAF coupling can also work for in-plane iMTJ film stack. FIG. 11 shows a bottom-pinned in-plane MTJ stack (600), which comprises a generic stack of substrate/seed layer (20)/seed layer(61)/antiferromagnetic layer(62)/pinned magnetic layer 1(63)/bi-layer spacer (33 or 34)/magnetic layer 2(65)/tunnel barrier(66)/storage layer(67)/capping layer(68)/hard mask(69), or adding specific material to each layer, Ta/(IrMn, or PtMn) (62)/CoFe(>50%)(63)/(Cr/Ru)(33 or 34)/Co(>50%)Fe(65)/MgO(66) /CoFe, NiFe, Fe(67)/W, Ta (68)/Ta(69), in which a strong exchange coupling is obtained at the interface of (IrMn, or PtMn)/CoFe. Similarly a top-pinned in-plane MTJ stack can be obtained by reversing the above film stack, Ta/CoFe, NiFe, or Fe/MgO/CoFe(50%)/Cr/Ru (43 or 44)/Co(>50%)/Fe/IrMn, or PtMn)/Ta (stack 700 as shown FIG. 12). With the use of bi-layer (Cr/Ru) or tri-layer (Cr/W/Ru) spacer, very strong synthetic ferromagnetic (eSAF) coupling will be obtained, which can used as a building film stack for in-plane STT-MRAM, TMR magnetic sensor or other spintronic devices. By replacing the tunnel barrier layer MgO with a conducting metal such as Cu, a so-called spin-valve GMR film stack can be obtained.

Fifth Embodiment

Figure 13:
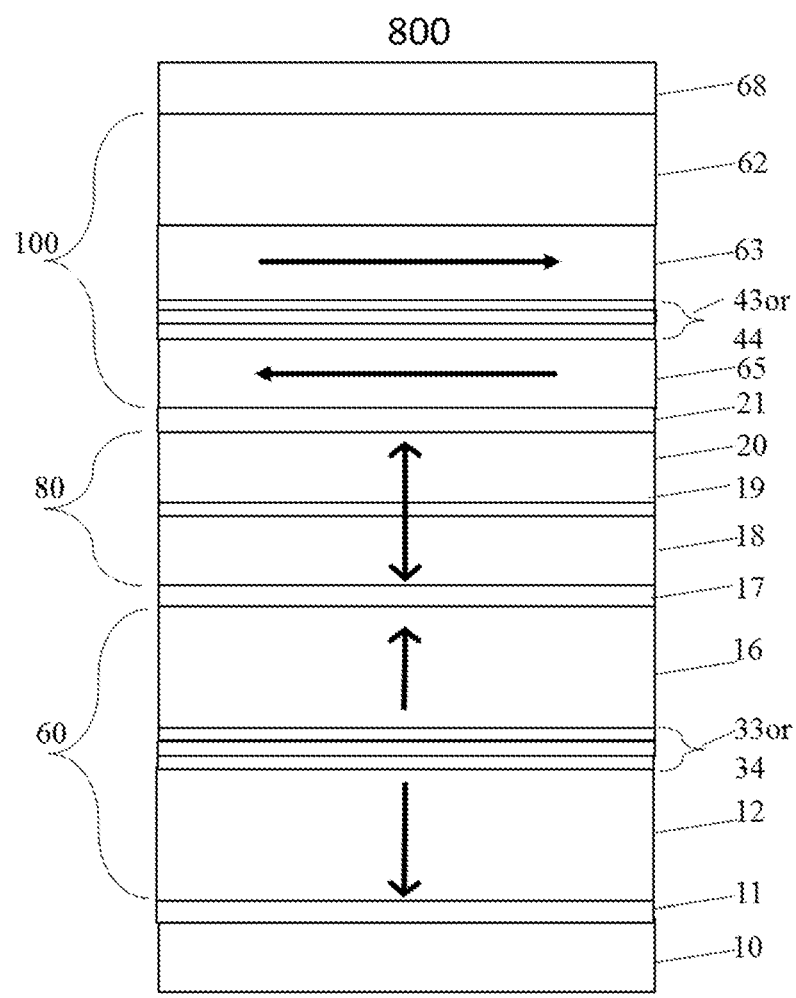
FIG. 13 A mutually perpendicular dual-pined STT-MRAM using two said eSAF.

By combining a bottom-pinned pMTJ stack with a top-pinned iMTJ stack, a mutual perpendicularly dual pined STT-MRAM can also be obtained (stack 800 as shown in FIG. 13), in which two mutually perpendicular magnetic pinning stacks of 60 and 100 sandwiching a CSL (80) containing two strong eSAF stacks with one (33 or 34) for bottom pinning of magnetic layers 12 and 16, and one (43 or 44) at the top for in-plane pinning through exchange coupling of magnetic layer 63 and 65. To avoid the influence of an excessive stray field from the top-pinned iMTJ, the magnetic moments of the layer 63 and 65 should be closely matched. By adjusting the thickness of the top MgO layer (21), the CSL (80) can magnetically stabilized, and its thickness can be increased to achieve a higher TMR signal. In FIG. 13, the layers 17 and 21 are two MgO tunnel barriers, layer 10 substrate, layer 11 seed, layer 62 cap and 68 Ta hard mark.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A synthetic magnetic pinning element (MPE) comprising
a magnetic pinning layer (PL) having a face-center-cubic (fcc) crystalline structure and having an invariable magnetization direction;
a magnetic reference layer (RL) having a body-center-cubic (bcc) crystalline structure and having an invariable magnetization direction;
a composite non-magnetic spacer (CnmS) having a bi-layer structure of (Ru, Rh or Ir)/Cr or tri-layer structure of (Ru, Rh, or Ir)/(W, Mo, or V)/Cr, provided between said magnetic pinning layer and said magnetic reference layer;
said PL/CnmS/RL form strong antiferromagnetic (AF) coupling.

2. The element of claim 1, wherein said AF coupling between said PL and said RL is achieved through interfacial RKKY coupling having at least one of the group Co/CnmS/Fe, Co/CnmS/FeB, FeCo(>50%)/CnmS/Fe(>50%)Co, or Co/CnmS/Fe(>40%)CoB; wherein said Co or FeCo(>50%) layer is an interfacial portion of PL contacting with the (Ru, Rh, or Ir) of said CnmS and said Fe, FeB, Fe(>50%)Co or Fe(>40%)CoB layer is an interfacial portion of RL contacting with the Cr of said CnmS.

3. The element of claim 1, wherein said (Ru, Rh or Ir) of said CnmS has a thickness between 0.3 nm to 0.7 nm and said Cr or (W, Mo, or V)/Cr of said CnmS has a thickness between 0.1 nm to 0.5 nm so that the total thickness combination of Ru/Cr or (W, Mo, or V)/Cr is at the (effective) first peak or $2^{nd}$ peak of RKKY coupling with their interfacial magnetic layers of Co and Fe.

4. The element of claim 1, wherein said magnetic pinning element (MPE) has its magnetization direction perpendicular to the surface of said film stack, and said MPE forms a perpendicular magnetic tunnel junction (pMTJ) together with a tunnel barrier (TB) and a storage layer (SL), whereas said TB is sandwiched between said SL and said PME.

5. The element of claim 4, wherein said magnetic pinning element (MPE) is at least one of multilayer stack group of [Co/(Pt or Pd)]n/Co/Ru/Cr/Fe/CoFeB or [Co/(Pt or Pd)]n/Co/Ru/(W, Mo, or V)/Cr/Fe/CoFeB, wherein n is an integer between 2 and 6, the thickness of each said Co and (Pt or Pd) is between 0.25 nm-0.7 nm and 0.2 nm-0.5 nm, respectively, and said Fe layer in contact with said Cr layer has a thickness between 0.1 nm-0.5 nm.

6. The element of claim 4, wherein said TB is an MgO layer having a thickness between 0.8 nm to 1.5 nm, and said RL is a single layer of CoFeB, FeB, CoFe or their combination with a total thickness between 0.8 nm to 1.3 nm; and said SL is a single layer CoFeB or tri-layer CoFeB/(W or Mo)/CoFeB having a total CoFeB thickness between 1 nm-2.0 nm, wherein said W or Mo has a thickness between 0.1 nm-0.5 nm.

7. The element of claim 4, wherein said pMTJ comprises a film stack of seed layer /PL/CnmS/RL/TB/SL/capping layer counting from bottom to top, forming a bottom-pinned pSTT-MRAM film element.

8. The element of claim 4, wherein said pMTJ comprises a film stack of seed layer/SL/TB/RL/CnmS/PL/capping layer counting from bottom to top, forming a top-pinned pSTT-MRAM film element.

9. The element of claim 4, wherein said pMTJ comprises a film stack of seed layer /PL1/CnmS1/RL1/TB1/SL/TB2/RL2/CnmS 2/PL2/capping layer, forming a dual-pinned pSTT-MRAM film element.

10. The element of claim 7, wherein said bottom-pinned pSTT-MRAM film element comprises a film stack of substrate/seed layer/[Co/Pt]n/Co/(Ru, Rh, or Ir)/Cr/Fe/CoFeB/MgO/CoFeB/W or Mo/CoFeB/MgO/W/Ru/Ta or substrate/Pt/[Co/Pt]n/Co/(Ru, Rh, or Ir)/(W, Mo, or V)/Cr/Fe/CoFeB/MgO/CoFeB/W or Mo/CoFeB/MgO/W/Ru/Ta, wherein said seed layer is a single Pt or bi-layer (CuN, TiN, Ru)/Pt with a thickness between 2 nm-10 nm and said top capping layers W/Ru have thickness 1 nm-3 nm/1-3 nm/50-100 nm, respectively, and often a top Ta hard mask with a thickness between 40-100 nm is also grown together with the MPE; wherein said CuN is a nitrogen-rich CuN to form an fcc crystalline structure with its lattice constant perfectly matched with Pt.

11. The element of claim 8, wherein said top-pinned pSTT-MRAM film element comprises a film stack of substrate/seed layer/MgO/CoFeB/W, or Mo/CoFeB/MgO/CoFeB/Fe/Cr/(Ru, Rh, or Ir)/Co/[Pt/Co]n/W/Ru/Ta or substrate/W/MgO/CoFeB/(W, Mo, or V)/CoFeB/MgO/CoFeB/Fe/Cr/(W, Mo, or V)/(Ru, Rh, or Ir)/Co/[Pt/Co]n/W/Ru/Ta; wherein said seed layer is W, Ta or Pt with a thickness between 5 nm-100 nm; said CnmS has a reversed order with Cr at the lower side and Ru on top contacting with Co.

12. The element of claim 9, wherein said dual-pinned pSTT-MRAM film element comprises a film stack of substrate/Pt/[Co/Pt]n/Co/(Ru, Rh, or Ir)/Cr/Fe/CoFeB/MgO/CoFeB/W/CoFeB/MgO/CoFeB/Fe/Cr/(Ru, Rh, or Ir)/Co/[Pt/Co]n/W/Ru/Ta or substrate/Pt/[Co/Pt]n/Co/(Ru, Rh, or Ir)/(W, Mo, or V)/Cr/Fe/CoFeB/MgO/CoFeB/W/CoFeB/MgO/CoFeB/Fe/Cr/(W, Mo or V)(Ru, Rh, or Ir)/Co/[Pt/Co]n/W/Ru/Ta; wherein two pairs of eSAF are used with the top eSAF having its order Cr & Ru reversed.

13. The element of claim 11, wherein said top-pinned pSTT-MRAM film element can be used as a building film stack for high speed SOT-MRAM, in which the bottom seed (W, Ta or Pt) layer serves as SOT write line to provide switch current for said memory layer; wherein the read current will go through said top-pinned pSTT-MRAM film stack with a robust eSAF pinning layer.

14. The element of claim 1, wherein said magnetic pinning element (MPE) has its magnetization direction within the surface of the film stack, and said MPE forms an in-plane magnetic tunnel junction (iMTJ) element together with a tunnel barrier (TB) and a magnetic storage layer (SL), and said MPE sits on the opposite side of said SL across the TB; wherein said iMTJ element can be used as a building film stack for in-plane MRAM, magnetic sensor or other spintronic devices.

15. The element of claim 14, wherein said magnetic pinning element (MPE) is a multilayer stack of Ta/(IrMn, or PtMn)/FeCo(>50%)/(Ru, Rh, Ir)/Cr/Fe/CoFe or Ta/(IrMn, PtMn)/FeCo(>50%)/(Ru, Rh, Ir)/(W, Mo, or V)/Cr/Fe/CoFe; wherein said Ta seed layer has a thickness between 2 nm-10 nm, said IrMn has a thickness between 4 nm-10 nm, and said PtMn has a thickness between 5-20 nm, said Co-rich FeCo (>50%) (in contact with IrMn and Ru) has thickness between 2 nm-5 nm; said Fe has a thickness between 0.5-1 nm and said CoFe (in contact with Fe) has a thickness between 2-5 nm; wherein said TB is MgO with a thickness between 1-2 nm, and said SL is CoFe, Fe, CoFe/Fe, or Fe/CoFe/Fe with a thickness between 2-20 nm.

16. The element of claim 1, wherein said magnetic pinning element (MPE) has its magnetization direction within the surface of the film stack, and said MPE forms an in-plane magnetic spin-valve or GMR film stack together with a metallic (Cu) spacer (MS) and a magnetic storage layer (SL), and said MPE sits on the opposite side of said SL across the MS.

17. The element of claim 16, wherein said GMR film stack comprises Ta/(IrMn, or PtMn)/FeCo(>50%)/(Ru, Rh, Ir)/Cr/Fe/CoFe/Cu/(Fe, CoFe, NiFe)/Ru/Ta, or Ta/(IrMn, or PtMn)/FeCo(>50%)/(Ru, Rh, or Ir)/(W, Mo, or V)/Cr/Fe/CoFe/Cu/(Fe, CoFe, NiFe)/Ru/Ta; wherein said Ta seed layer has a thickness between 2-10 nm, said IrMn has a thickness between 4 nm-10 nm, and said PtMn has a thickness between 5 nm-20 nm, said CoFe (in contact with IrMn, or PtMn and Ru) has thickness between 2 nm-5 nm; said Fe has a thickness between 0.5 nm-1.5 nm and said CoFe (in contact with Fe) has a thickness between 2-5 nm, said Cu has a thickness between 1.5 nm-3 nm, and said SL (Fe, CoFe, or NiFe) has a thickness between 5-10 nm; wherein said GMR film element be used as a building film stack for magnetic sensor or other spintronic devices.

* * * * *